(12) United States Patent
Vu et al.

(10) Patent No.: US 8,030,920 B2
(45) Date of Patent: Oct. 4, 2011

(54) METHOD AND SYSTEM FOR MODIFYING PULSE SEQUENCES

(75) Inventors: Anthony Tienhuan Vu, Waukesha, WI (US); Wei Sun, Waukesha, WI (US); Ersin Bayram, Delafield, WI (US)

(73) Assignee: General Electric Company, Schenectady, NY (US)

( * ) Notice: Subject to any disclaimer, the term of this patent is extended or adjusted under 35 U.S.C. 154(b) by 197 days.

(21) Appl. No.: 12/477,709

(22) Filed: Jun. 3, 2009

(65) Prior Publication Data

US 2010/0308829 A1 Dec. 9, 2010

(51) Int. Cl.
*G01V 3/00* (2006.01)
(52) U.S. Cl. ........................... 324/307; 324/309
(58) Field of Classification Search .................. 324/307, 324/309; 600/410
See application file for complete search history.

(56) References Cited

U.S. PATENT DOCUMENTS

| | | | |
|---|---|---|---|
| 5,512,825 A | 4/1996 | Atalar et al. | |
| 6,020,739 A | 2/2000 | Meyer et al. | |
| 6,198,282 B1 | 3/2001 | Dumoulin | |
| 6,501,977 B1 * | 12/2002 | Kimmlingen | 600/410 |
| 7,047,062 B2 * | 5/2006 | Licato et al. | 600/410 |
| 7,301,341 B2 | 11/2007 | Hargreaves et al. | |
| 7,412,278 B2 * | 8/2008 | Harvey et al. | 600/416 |
| 2008/0164875 A1 | 7/2008 | Haworth et al. | |
| 2008/0224697 A1 | 9/2008 | Saranathan et al. | |
| 2008/0238425 A1 | 10/2008 | Xu et al. | |
| 2008/0272787 A1 | 11/2008 | Boskamp et al. | |

\* cited by examiner

*Primary Examiner* — Louis Arana
(74) *Attorney, Agent, or Firm* — Fletcher Yoder (57) ABSTRACT

Methods and systems are provided for modifying a pulse sequence. In one embodiment, a determination is made whether an estimated peripheral nerve stimulation (PNS) associated with a pulse sequence exceeds a PNS limit. If the estimated PNS exceeds the PNS limit, a slew rate associated with one or more axes of the pulse sequence may be reduced and the maximum gradient amplitudes for each axis of the pulse sequence may be adjusted. In one embodiment, adjustment of the maximum gradient amplitudes or local slew rate may be based upon a cost analysis performed on the pulse sequence.

18 Claims, 5 Drawing Sheets

METHOD AND SYSTEM FOR MODIFYING PULSE SEQUENCES

BACKGROUND

The subject matter disclosed herein relates generally to magnetic resonance imaging systems and, more particularly, to techniques for designing and implementing pulse sequences on magnetic resonance imaging systems.

The use of medical imaging technologies has become commonplace in the medical community. Such imaging technologies typically allow the acquisition of images which depict the internal structures (internal tissues and organs, bones, and so forth) and/or biochemical functions of a patient without the use of invasive procedures. That is, medical imaging technologies typically allow the internal structures and/or functions of a patient to be observed without surgery or other invasive procedures.

One such medical imaging technology is known as magnetic resonance imaging (MRI). MRI systems typically employ magnetic fields and pulses of radio frequency (RF) energy to generate images based on the gyromagnetic properties of tissues and structures within the body. For example, MRI systems may employ a primary magnetic field to generally orient susceptible molecules (such as hydrogen nuclei in water molecules) within the field and a RF pulse to disrupt this orientation. The reorientation of molecules within the primary magnetic field after this disruption may generate signals that may be detected and used to generate images of the internal structures and/or functions within the patient. Time-varying magnetic gradient fields may also be applied to the subject so that the generated signals may be localized with respect to x-, y-, and z-axes, allowing an image to be generated.

Imaging performance not only depends on the hardware capabilities, but also patient safety constraints imposed on the system. In some instances it may be difficult to achieve the highest imaging performance due to patient safety constraints imposed on the pulse sequences, which describe the timing and operation of the magnetic and RF fields generated by the imaging system. Commercially available MRI scanners provide safety models based on the guidelines provided by governing control bodies (FDA, IEC etc.) to restrict scanner operation to safe limits. For example, constraints on slew rate (how fast the gradient waveforms can be changed) may be imposed to avoid certain types of peripheral nerve stimulation. Such constraints, however, may limit imaging performance. Earlier MRI systems were largely limited by the hardware capabilities. With the recent technological advances, safety constraints are becoming the new bottleneck in achieving the highest possible imaging performance.

BRIEF DESCRIPTION

In one embodiment, a method is provided for modifying a pulse sequence. The method includes the act of calculating timing and amplitudes of a pulse sequence. A cost function analysis is performed on desired gradient overlap regions of the pulse sequence and the available encoding time determined based on the costliest axis per overlap region. A maximum gradient amplitude for one or more gradient axes is reset based on the cost function analysis and/or a local slew rate is reset (up to global slew rate) for one or more gradient axes based on the cost function analysis to utilize some or all of the available encoding time per overlap region. A peripheral nerve stimulation (PNS) model is applied based at least in part on the pulse sequence and an output of the PNS model is compared to a PNS limit. A global slew rate used to calculate the timing of the pulse sequence is adjusted if the output of the PNS model exceeds the PNS limit and timing and amplitudes of the pulse sequence are recalculated based on the adjusted global slew rate and the reset maximum gradient amplitudes and/or the local slew rate. The steps of applying, comparing, adjusting, performing, resetting, and recalculating are repeated until the output of the PNS model is within the PNS limit In another embodiment, a magnetic resonance imaging (MRI) system is provided. The MRI system comprises a MRI scanner and scanner control circuitry capable of controlling operation of the scanner. The scanner control circuitry comprises a memory capable of storing one or more routines for adjusting a pulse sequence and control circuitry capable of implementing the one or more routines. The one or more routines, when executed, calculate timing and amplitudes for a pulse sequence, compare an estimate of peripheral nerve stimulation (PNS) associated with the pulse sequence against a PNS limit, adjust one or more of the slew rate and the maximum gradient amplitude for each axis if the estimate of PNS exceeds the PNS limit, and recalculate the timing and amplitudes for the pulse sequence until the estimate of PNS does not exceed the PNS limit. The MRI system also comprises system control circuitry capable of controlling operation of the scanner control circuitry.

In a further embodiment, a computer-readable medium physically encoding one or more routines is provided. The computer-readable medium comprises a routine capable of calculating timing and amplitudes of a pulse sequence and a routine capable of comparing an estimate of peripheral nerve stimulation (PNS) associated with the pulse sequence against a PNS limit. In addition, the computer-readable medium comprises a routine capable of adjusting one or more of a slew rate and a maximum gradient amplitude for each axis of the pulse sequence if the estimate of PNS exceeds the PNS limit. The computer-readable medium also comprises a routine capable of recalculating the timing and amplitudes for the pulse sequence until the estimate of PNS does not exceed the PNS limit.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Magnetic resonance imaging (MRI) is a useful technology for generating internal views of a patient that might not be easily obtained using other techniques. In addition, to generate images, an MRI system utilizes magnetic fields and radio frequency (RF) energy and, therefore does not subject the patient to X-rays or gamma rays where the patient dosage may be an issue. The timing and strength of the various magnetic and RF fields that may be generated as part of a MRI examination may be described by a pulse sequence diagram. Such a pulse sequence diagram may describe aspects of the examination such as the repetition time (TR) (the time between the application of one RF pulse and the next RF pulse), echo time (TE) (the time between the application of an RF pulse and the signal peak detected at the RF coil), echo spacing, and so forth. In general, improved imaging performance may generally be equated with minimizing or reducing TR, TE, and echo spacing. In theory, these values may be minimized or reduced by utilizing the maximum gradient amplitude (typically measured in G/cm) and slew rate (how fast the gradient waveforms can be changed, typically measured in mT/m/s) allowed by the hardware of the MRI system.

In practice, however, slew rates lower than the maximum possible may be employed to prevent peripheral nerve stimulation (PNS) in the subject. In particular, slew rates may be constrained to established limits, with an iterative global slew rate derating algorithm being employed to maximize the slew rate within this constraint. Such methods may be computationally efficient, but may have other shortcomings. For example, techniques employing iterative global slew rate derating employ the same slew rate for all gradient pulses and may simply lower the slew rate enough to ensure that the PNS fraction at any time during gradient play does not exceed a set limit. Such approaches may not yield the shortest TE for a given pulse sequence, which is generally the desired result. Further, typical approaches for addressing PNS limitations may result in gradient sub-system hardware designed for lower performance actually outperforming corresponding higher performance sub-system hardware.

For example, there are commercially available MRI imaging systems that are capable of a maximum slew rate of 200 mT/m/s and maximum gradient amplitude of 5 G/cm, but they may only utilize a global slew rate of about 85 mT/m/s when executing an imaging protocol having a field of view (FOV)=25 cm, matrix size of 264×256, and 100 slices with receiver bandwidth=+/−142.86 kHz when under an International Electrotechnical Commission (IEC) first level controlled operating mode. Under such constraints and using this protocol, echo times (TE) of 1.7 ms and 3.3 ms are achievable, which are outside the range of 1.2-1.5 ms and 2.4-2.8 ms desired for successful water-fat decomposition. A similar protocol executing on an imaging system only capable of a slew rate of 150 mT/m/s and 4 G/cm may achieve a higher global slew rate of about 122 mT/m/s under the same PNS constraint. Using this comparable protocol and lower performance hardware (and under the same PNS constraint), echo times of 1.4 ms and 2.6 ms may be achieved, which are within the desired range for successful water-fat decomposition. Thus, higher performance hardware may have worse imaging performance for certain imaging protocols when constrained to avoid invoking PNS. The present disclosure proposes a novel approach to modifying pulse sequence waveforms to achieve higher imaging performance (TE, TR, echo spacing) and/or lower acoustic noise pressure level while observing standard safety constraints.

Figure 1:
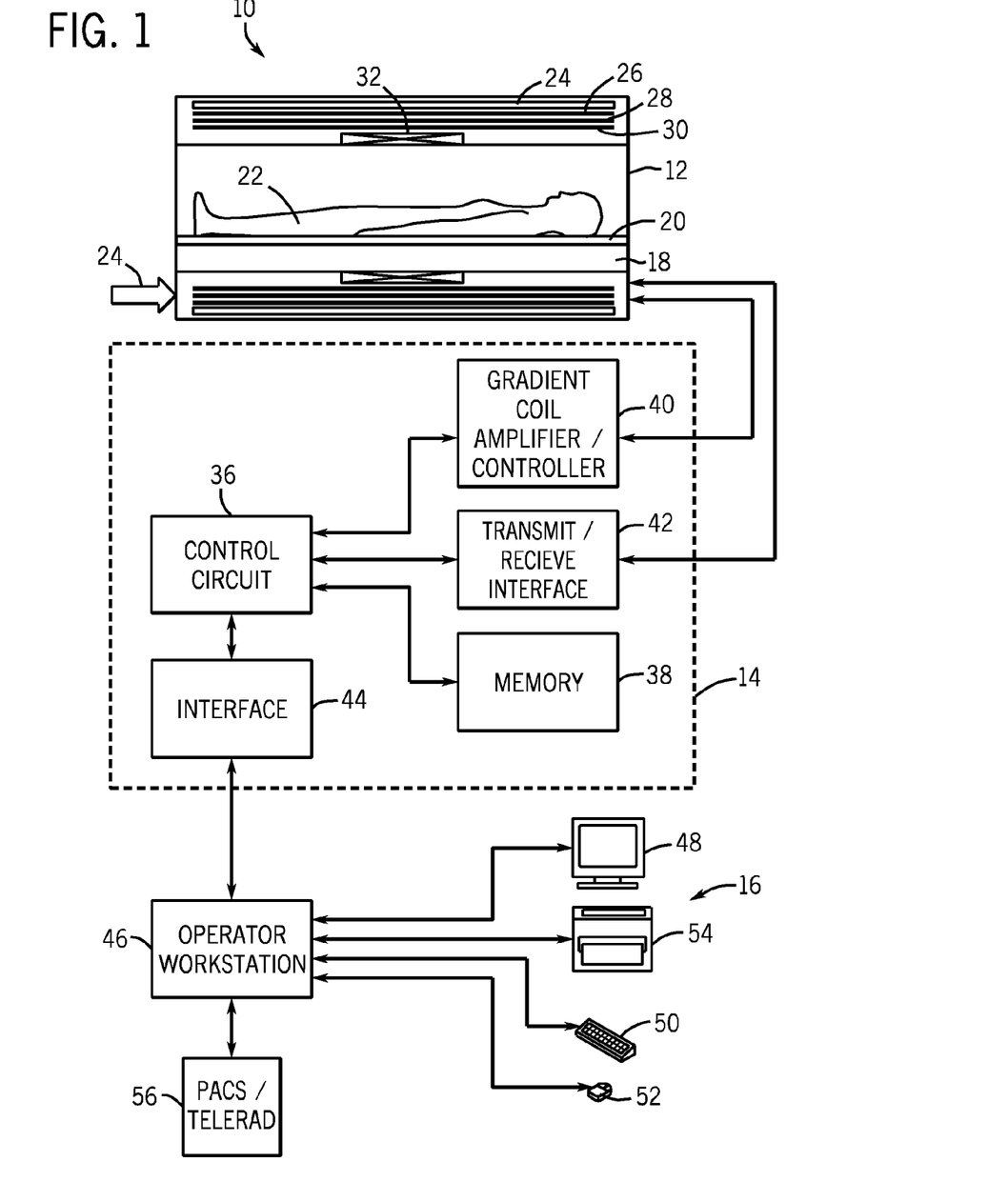
FIG. 1 is a diagrammatical representation illustrating an embodiment of an MRI system that employs interleaved gradient coils in accordance with an aspect of the present disclosure.

With the foregoing in mind, and turning now to the drawings, FIG. 1 depicts a magnetic resonance imaging (MRI) system 10 that includes a scanner 12, scanner control circuitry 14, and system control circuitry 16. While the MRI system 10 may include any suitable MRI scanner or detector, in the illustrated embodiment the system includes a full body scanner comprising a patient bore 18 into which a table 20 may be positioned to place a patient 22 in a desired position for scanning. The scanner 12 may be of any suitable type of rating, including scanners varying from 0.5 Tesla ratings to 1.5 Tesla ratings and beyond.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a primary magnet coil 24 is provided for generating a primary magnetic field generally aligned with the patient bore 18. A series of gradient coils 26, 28 and 30 are grouped in a coil assembly for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 also serves as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28 and 30 may be formed of conductive wires, bars or plates which are wound or cut to form a coil structure which generates a gradient field upon application of control pulses. The placement of the coils within the gradient coil assembly may be done in several different orders and with varying configurations, as described in greater detail below. Generally, a z-gradient coil 26 may be positioned at an outermost location, and is formed generally as a solenoid-like structure which has relatively little impact on the RF magnetic field. The coils 28 and 30 may be x-axis and y-axis coils respectively.

The coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF frequency pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28 and 30 may serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the axial component of the magnetic field strength across the field of view. The field may vary linearly in one direction, but may be homogenous in the other two. The three coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axis of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the read-out gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices (or other suitable computer-readable media) for storing physical and logical axis configuration parameters, examination pulse sequence descriptions, acquired image data, programming routines (including routines for implementing pulse sequence modifications as discussed herein), and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The station also typically includes memory circuitry (or other suitable computer readable media) for storing examination pulse sequence descriptions, examination protocols, user and patient data, image data, both raw and processed, and so forth, such as pulse sequence descriptions, protocols, routines, and algorithms suitable for implementing the presently disclosed techniques when executed on the workstation 46. The station may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

In certain embodiments, an MRI system 10 as described with respect to FIG. 1 may be used to execute imaging protocols and generate images under certain constraints or limitations to prevent peripheral nerve stimulation (PNS) in a patient. The rate of change of the magnetic field (db/dt) employed by an MRI scanner 12 that might invoke PNS may be described by:

$$\left(\frac{db}{dt}\right)_{ij} = \frac{\Delta G_{ij} \times L_i}{\Delta t_j} = SR_{ij} \times L_i \quad (1)$$

where $\Delta G_{ij} = G_{ij} - G_{i(j-1)}$ is the amplitude change, $SR_{ij}$ is the slew rate, $L_i$ is the effective coil length for axis i, and $\Delta t_j = t_j - t_{j-1}$ is the segment duration. In MRI systems where the effective coil length is longer relative to other systems, the rate of change of the magnetic field may be higher for the same gradient waveform. That is, systems having relatively long effective coil lengths (including systems employing high performance gradient hardware) may be more likely to hit limits on the rate of change of the magnetic field (db/dt) imposed to prevent PNS sooner relative to systems having shorter effective coil lengths.

With respect to PNS constraints, it may be appreciated that the mean threshold of nerve stimulation, $(d|B|/dt)_{th}$, may depend on a variety of factors, such as the gradient ramp duration ($t_s$), the stimulation threshold for infinite duration gradient ramp times (i.e., the rheobase, rb), and the gradient ramp time associated with stimulation thresholds double the rheobase (i.e., the chronaxie, c). Stimulation limits may include a fraction, f, of the mean such that, when f=1, the limit is equal to the stimulation mean. This may be represented as:

$$\left[\frac{d|B|}{dt}\right]_{lim} = f * rb\left[1 + \frac{c}{t_s}\right], \quad (2)$$

which yields $$f(t_s) = \frac{\left[\frac{d|B|}{dt}\right]_{lim}}{rb*\left[1 + \frac{c}{t_s}\right]} = \frac{[SR*L*t_s]_{lim}}{rb*[t_s + c]}, \quad (3)$$

where overall PNS fraction, f, is the quadrature sum of the individual axis fractions:

$$f = \sqrt{f_x^2 + f_y^2 + f_z^2}. \quad (4)$$

With the foregoing in mind, it may be noted that f, i.e., the overall PNS fraction, may be reduced (or minimized) by reducing (or minimizing) the gradient ramp duration, $t_s$ and/or by reducing (or minimizing) the slew rate SR. For a given slew rate and encoding area, gradient ramp duration, $t_s$, may be reduced by utilizing a lower gradient amplitude. In general, the maximum available gradient amplitude per axis may be restricted on pulse segments where there is no RF excitation or signal acquisition (e.g., regions with overlap gradients). Further, the total PNS fraction, $f(t_s)$, can be reduced by reducing or minimizing some or all of the individual axes, x, y, and/or z. In addition, as discussed above, a lower PNS fraction, $f(t_s)$, may enable the use of a higher global slew rate.

Thus, in designing a pulse sequence for use under PNS limitations, it may be desirable to reduce or minimize PNS fraction, $f(t_s)$ by reducing or minimizing gradient ramp duration, $t_s$, and to reduce or minimize total PNS fraction, $f(t_s)$, by reducing or minimizing individual fraction per x, y, and/or z axis. Further, it should also be recognized that, in general, each axis may have a different gradient demand due to different area encoding requirements that may lead to each axis being most suited to a different minimum echo time (TE). Thus, for a given slew rate and area encoding, ramp duration can be reduced by using a lower gradient amplitude, leading to a short ramp solution at the expense of a longer gradient duration. Similarly, the global slew rate can be used for axes with highest demand; whereas, lower local slew rate can be employed for axes with lower demand. In this manner, increasing gradient duration by using lower gradient amplitude and/or lower local slew rate when appropriate can result in a lower PNS fraction, $f(t_s)$, that allows the use of a higher global slew rate.

The above factors may be accounted for in applying an adaptive gradient waveform shaping approach as discussed herein. For example, a cost function may be computed for each gradient segment in an overlap region for each axis. Examples of suitable cost functions include, but are not limited to, the weighted total gradient area and/or the peak gradient amplitude, with weighting factors employed to favor particular axes where appropriate. For example, in one embodiment, the cost function for a pre-signal acquisition overlap region may be based on an area calculation, such as based upon the respective weighted (phase) encoding (y, z), dephaser (x), and rephaser (z) areas. Similarly, the cost function for a post-signal acquisition overlap region may be based on an area calculation, such as based upon the respective weighted (rewinder) encoding (y, z), killer/crusher (x), and killer/crusher (z) areas. In such an embodiment, the costliest axis may be determined, i.e., the axis having the greatest calculated area in the overlap region, and the available encoding time calculated for that axis. In one implementation, a higher gradient amplitude and/or global slew rate may be utilized on this axis to achieve the shortest feasible pulse duration. Conversely, on less costly axes, the gradient duration may be extended to utilize most if not all of the available encoding time. For example, on less costly axes, a smaller gradient amplitude and shorter ramp duration may be employed, though with the same global slew rate as for the more costly axis. Alternatively, the gradient duration may be extended by using lower local slew rate on less costly axes.

Figure 2:
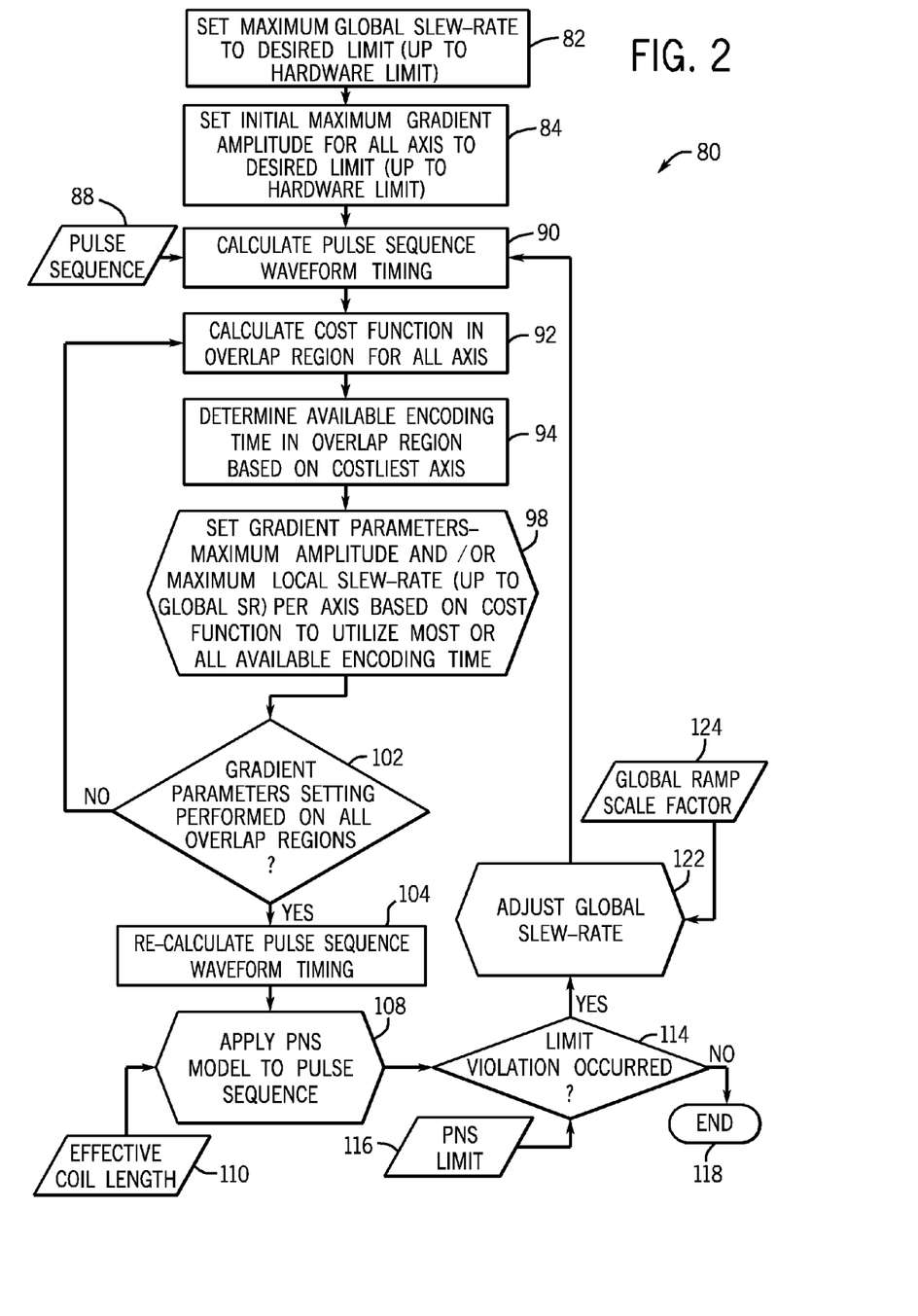
FIG. 2 depicts a flow chart depicting steps for revising a pulse sequence in accordance with an aspect of the present disclosure.

With the foregoing in mind and turning now to FIG. 2, a flowchart is provided depicting an example of an algorithm 80 that may be employed in implementing the present technique. In this example, a slew rate may be set to some desired limit (block 82) up to the highest slew rate allowed based on the hardware limitations of the system 10 (FIG. 1). For example, a slew rate of 200 mT/m/s may be set automatically by the imaging system or by a user of the imaging system. An initial maximum gradient amplitude (such as 5 G/cm) may also be set (block 84) automatically by the imaging system or by a user for all axes.

A pulse sequence 88 may be selected based on the desired imaging protocol and timing for the selected pulse sequence waveform may be calculated (block 90) based on the current global slew rate, maximum gradient amplitudes for the axes, and the pulse sequence 88. The cost functions for each axis in each overlap region are calculated (block 92) based on metrics such as the weighted encoding area or other ranking scheme based on area, amplitude, duration and so forth. The available encoding time for the overlap region is determined based on the costliest axis (block 94). Using the current global slew rate, the gradient parameters (maximum amplitude, local slew rate) may be reset (block 98) for each axis based on the previously determined cost function and available encoding time. In one embodiment, the gradient duration and amplitude at each axis may be rescaled, based on the ranking or cost estimate as described herein, such as to keep the area constant. For example, in one implementation, maximum gradient amplitude may be increased on the costliest axis to achieve the shortest feasible pulse duration. Conversely, on less costly axes, the gradient duration may be extended to use most if not all the available encoding time, the maximum gradient amplitude decreased, and a shorter ramp duration may be employed. In both cases, the calculated area may be unchanged. Further, the same global slew rate may be used for all axes in such an implementation. Optionally, in another implementation, the global slew rate can be used on the costliest axis; whereas, on less costly axes, the gradient duration may be extended by lowering the local slew rate.

In the depicted embodiment, resetting the gradient parameters may be performed for all desired overlap regions (block 102) based on target applications such as TE optimization, TE/TR optimization etc. Timing for the pulse sequence waveform is re-calculated using the latest gradient parameter setting (block 104). A PNS model may be applied (block 108) based on the calculated pulse sequence waveform and timing and on the effective coil length 110 of the MR imaging system. As an output, the PNS model may generate an estimate of the degree of PNS or the likelihood of PNS based on the proposed pulse sequence and timing and the system effective coil length 110. A determination may then be made (block 114) whether a PNS limit 116 would likely be exceeded by the MR system implementing the proposed pulse sequence and timing. If the determination is that the limit would likely not be exceeded, the algorithm 80 may be terminated (block 118) and the proposed pulse sequence and timing implemented on the MRI system in accordance with the desired imaging protocol.

If the determination is that the limit would likely be exceeded, the algorithm 80 may decrease (block 122) the global slew rate, such as by between 1% to 25% across some or all of the axes. For example, in some embodiments, the global slew rate may be decreased by 1%, 5%, 10%, 15%, 20%, or 25% on one or more of the axes. In certain implementations, the degree of global slew rate decrease may be based on the degree by which the PNS limit 116 was exceeded by the estimate generated by the PNS model. In addition, the decrease of the slew rate may take into account or be based on the ramp scale factor 124.

Based on the reset gradient parameters for each axis and the decreased global slew rate, the timing of the proposed pulse sequence waveform 88 may be recalculated (block 90) and the process iterated until the PNS limit 116 is not exceeded. Further, in subsequent iterations adjustment to the global slew rate (block 122) may increase the global slew rate if the estimated PNS from the model is sufficiently below the PNS limit 116, as determined in subsequent iterations at block 114. In this manner, a suitable global slew rate that does not result in the PNS limit 116 being exceeded may be determined. A final pulse sequence revised in accordance with the algorithm 80 or a similar algorithm may be utilized by an MRI system to acquire images of a patient.

One advantage provided by adaptive slew rate adjustment as discussed herein, such as with respect to algorithm 80, is that reduction or minimization of the gradient ramp duration in accordance with a PNS equation allows the individual axis PNS fraction and the total PNS fraction to be reduced or minimized without detailed knowledge of where pulse segments across axes might overlap. Further, gradient amplitude per axis as discussed herein may be solved directly via quadratic equation to provide a physically realizable solution for a given target slew rate and pulse duration. Further, gradient amplitude modulation per axis based on a cost function (or other ranking function) may provide improved imaging performance because the target duration may be determined based on the costliest axis where the highest gradient amplitude (up to the hardware limit) is used. The lower gradient amplitude utilization on less costly axes may provide lower acoustic sound pressure level; thereby, improving patient comfort.

Cost function analyses as discussed herein may be performed for each overlap region of a pulse sequence, regardless of the imaging protocol or technique employed. For example, in a TE minimized application of a gradient echo imaging implementation, the pre-signal acquisition region may be modified or optimized as described herein while the post-signal acquisition region might be unchanged. Likewise in a TE/TR minimized application, both the pre-signal acquisition region and the post-signal acquisition region may be modified or optimized independently.

As will be appreciated, from the preceding discussion, any or all of amplitude, slew rate, and/or pulse duration may be modified on any axis to improve a pulse sequence with respect to a desired PNS threshold. For example, in addition to the implementations discussed above, the duration and/or gradient amplitude along an axis may be adjusted and the slew rate back calculated. In such an embodiment, the same or a similar result may be achieved, but the change may be driven based upon the duration and/or gradient amplitude as opposed to the slew rate.

Some or all of the algorithm 80 may be performed by processing components of an MR image acquisition system, such as the control circuit 36 or the operator workstation 46 (FIG. 1). In such implementations, one or more routines for implementing the algorithm 80 may be stored in a memory or other computer readable structure provided in or accessible by the respective processing components of the MR imaging system. Further, such routines may be provided on computer-readable structures for providing new routines, i.e., upgrading existing MR imaging systems to allow existing systems to execute routines for implementing an algorithm as described herein.

Figure 3:
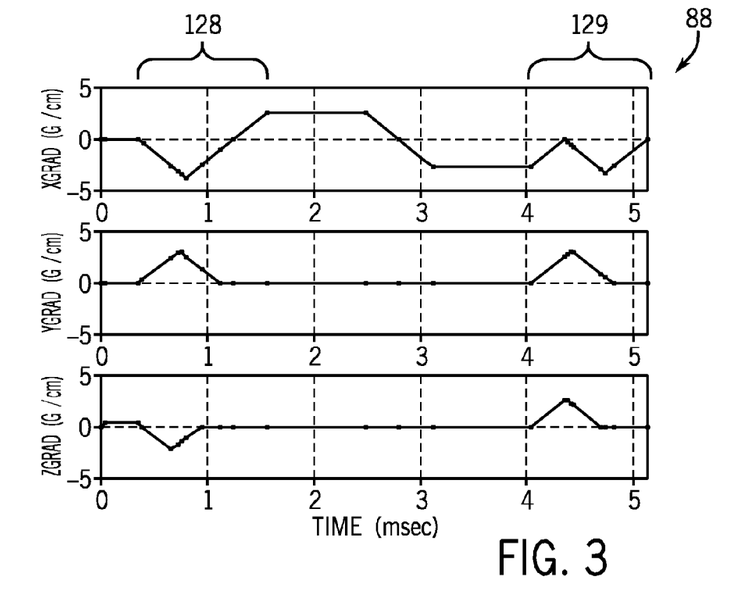
FIG. 3 depicts an initial pulse sequence in accordance with an aspect of the present disclosure.
Figure 4:
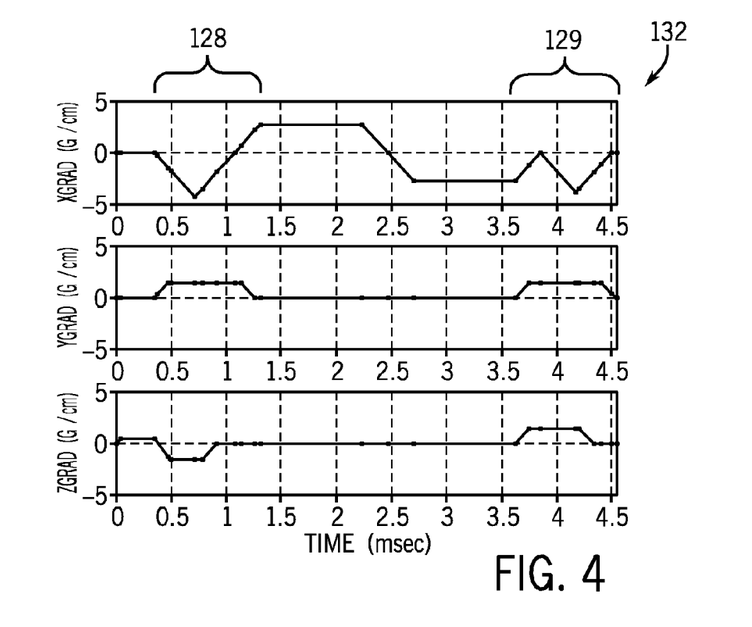
FIG. 4 depicts a revised pulse sequence in accordance with an aspect of the present disclosure.

By way of example of an implementation, FIG. 3 depicts an example of an initial pulse sequence 88 diagram where the timing of pulses is provided on the x-axis and the amplitude of the pulses is provided on the y-axis. In this example, the proposed Vibrant-Flex pulse sequence is for a 3D GRE dual-echo imaging protocol having an in-plane slice resolution of 264×256, 100 slices, rbw=±142.86 kHz, a FOV=25 cm, TE=1.7/3.3 ms, and a slew rate=85 mT/m/s. The gradient segments in the pre-signal acquisition overlap region 128 may be assessed, such as by calculating a cost function, to determine the costs or ranks associated with each axis. Based on this cost and PNS modeling as discussed above, and after implementation of the algorithm 80 (FIG. 2), a revised pulse sequence 132 (FIG. 4) may be generated. In the revised pulse sequence 132, the timing and/or amplitude has been adjusted for all three axes to provide a higher slew rate with echo times suitable for water-fat decomposition of the resulting images. In particular, in this example, the revised pulse sequence 132 has a slew rate of 117 mT/m/s and TE=1.4/2.8 ms while observing the PNS limit 116.

Figure 5:
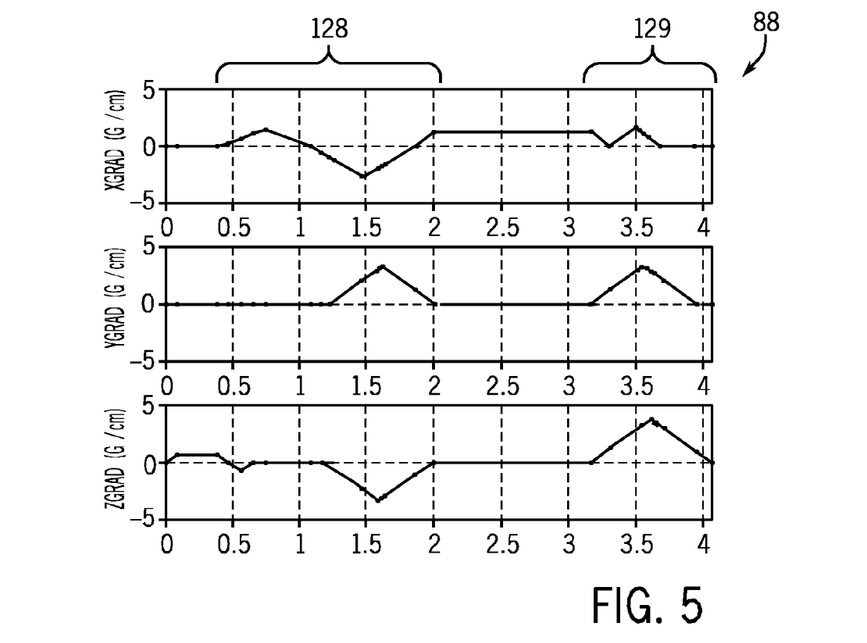
FIG. 5 depicts an initial pulse sequence in accordance with an aspect of the present disclosure.
Figure 6:
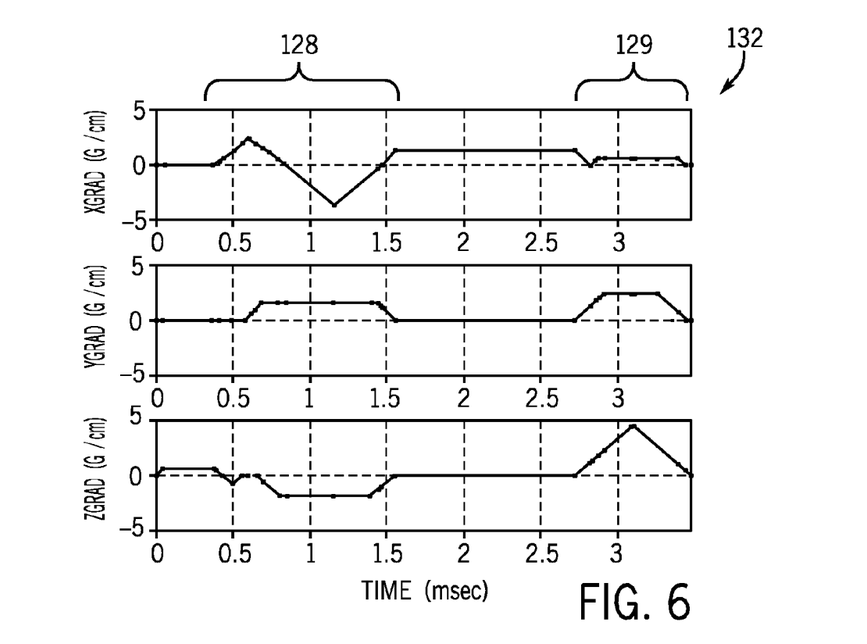
FIG. 6 depicts a revised pulse sequence in accordance with an aspect of the present disclosure.

Similarly, FIG. 5 depicts another example of an initial pulse sequence 88 diagram. In this example, the proposed pulse sequence is for a 3D SGPR imaging protocol with flow compensation and having an in-plane slice resolution of 384× 512, 100 slices, rbw=±125.0 kHz, a FOV=48 cm, TE/TR=2.1/4.2 ms, and a slew rate 70 mT/m/s. The gradient segments in the pre-signal acquisition overlap region 128 may be assessed as discussed herein to determine the costs or ranks associated with each axis. The gradient segments in the post-signal acquisition overlap region 129 may also be assessed, such as by calculating a cost function, to determine the costs or ranks associated with each axis. Based on these costs and PNS modeling as discussed above, and after implementation of the algorithm 80 (FIG. 2), a revised pulse sequence 132 (FIG. 6) may be generated. In the revised pulse sequence 132, the timing and/or amplitude has been adjusted for all three axes to provide a higher slew rate with echo and repetition times suitable for water-fat decomposition of the resulting images. In particular, in this example, the revised pulse sequence 132 has a slew rate of 122 mT/m/s and TE/TR=1.6/3.6 ms while observing the PNS limit 116.

Figure 7:
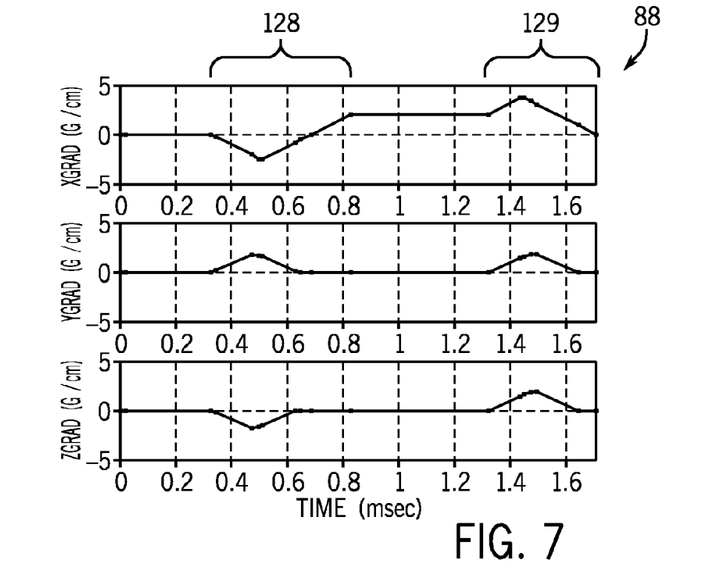
FIG. 7 depicts an initial pulse sequence in accordance with an aspect of the present disclosure.
Figure 8:
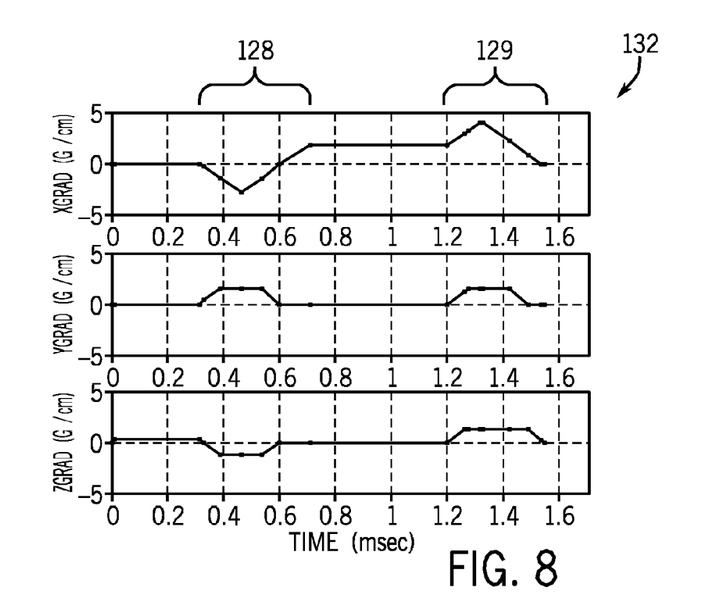
FIG. 8 depicts a revised pulse sequence in accordance with an aspect of the present disclosure.

In addition, FIG. 7 depicts a further example of an initial pulse sequence 88 diagram. In this example, the proposed pulse sequence is for a 3D SGPR imaging protocol with fractional echo acquisition and having an in-plane slice resolution of 256×128, 66 slices, rbw=±200.0 kHz, a FOV=48 cm, TE/TR=0.73/1.88 ms, and a slew rate=140 mT/m/s. The gradient segments in the pre-signal acquisition overlap region 128 may be assessed as discussed herein to determine the costs or ranks associated with each axis. Based on this cost and PNS modeling as discussed above, and after implementation of the algorithm 80 (FIG. 2), a revised pulse sequence 132 (FIG. 8) may be generated. In the revised pulse sequence 132, the timing and/or amplitude has been adjusted for all three axes to provide a higher slew rate with echo and repetition times suitable for water-fat decomposition of the resulting images. In particular, in this example, the revised pulse sequence 132 has a slew rate of 200 mT/m/s and TE/TR=0.62/1.66 ms while observing the PNS limit 116.

Technical effects of the invention include adjusting a pulse sequence for use by a MR imaging apparatus to increase global slew rate while constrained by a PNS limitation. Technical effects also include the acquisition of images by an MR imaging system using a pulse sequence adjusted to allow an increased global slew rate while constrained by a PNS limitation.

This written description uses examples to disclose different aspects of the present disclosure, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for modifying a pulse sequence, the method comprising the steps of:
   calculating timing and amplitudes of a pulse sequence;
   performing a cost function analysis on desired gradient overlap regions of the pulse sequence;
   determining the available encoding time based on the costliest axis per overlap region;
   resetting a maximum gradient amplitude for one or more gradient axes based on the cost function analysis and/or resetting local slew rate, up to global slew rate, for one or more gradient axes based on the cost function analysis to utilize some or all of the available encoding time per overlap region;
   applying a peripheral nerve stimulation (PNS) model based at least in part on the pulse sequence;
   comparing an output of the PNS model to a PNS limit;
   adjusting a global slew rate used to calculate the timing of the pulse sequence if the output of the PNS model exceeds the PNS limit;
   recalculating timing and amplitudes of the pulse sequence based on the adjusted global slew rate and the reset maximum gradient amplitudes and/or the local slew rate; and
   repeating the steps of applying, comparing, adjusting, performing, resetting, and recalculating until the output of the PNS model is within the PNS limit.

2. The method of claim 1, comprising setting an initial slew rate to a desired limit up to the maximum value allowed for an MRI system of interest.

3. The method of claim 1, comprising setting the initial maximum gradient amplitude for the one or more gradient axes.

4. The method of claim 1, comprising initially setting the maximum gradient amplitude for the one or more gradient axis to desired limit up to the maximum value allowed for an MRI system of interest.

5. The method of claim 1, wherein adjusting the global slew rate comprises reducing between about 1% to about 25% across some or all of the axes.

6. The method of claim 1, wherien the global slew rate is adjusted based on a ramp scale factor.

7. The method of claim 1, wherein the cost function analysis per overlap region comprises one or more of a total gradient area or a peak gradient amplitude in the particular overlap region.

8. The method of claim 1, wherein the cost function analysis may be performed for each gradient segment in an overlap region for each axis.

9. The method of claim 1, wherein the cost function analysis for pre-signal acquisition overlap region is based on the weighted (phase) encoding (y,z) area, dephaser (x) area, and rephaser (z) area.

10. The method of claim 1, wherein the cost function analysis for post-signal acquisition overlap region is based on the weighted (rewinder) encoding (y,z) area, killer/crusher (x) area, and killer/crusher (z) area.

11. The method of claim 1, wherein resetting the maximum gradient amplitude for one or more gradient axes comprises increasing the gradient amplitude on the axis determined to be costliest by the cost function analysis.

12. The method of claim 1, wherein resetting the maximum gradient amplitude for one or more gradient axes comprises reducing the gradient amplitude and extending the gradient duration to use some or all the available encoding time on one or more axes determined not to be the costliest by the cost function analysis.

13. The method of claim 1, wherein resetting local slew rate for one or more gradient axes comprises using the available global slew rate on the axis determined to be costliest by the cost function analysis.

14. The method of claim 1, wherein resetting local slew rate for one or more gradient axes comprises reducing slew rate and extending the gradient duration to use some or all of the available encoding time on one or more axes determined not to be the costliest by the cost function analysis.

15. A magnetic resonance imaging (MRI) system, comprising:
   an MRI scanner;
   scanner control circuitry capable of controlling operation of the scanner, the scanner control circuitry comprising:
      a memory capable of storing one or more routines for adjusting a pulse sequence;
      control circuitry capable of implementing the one or more routines, wherein the one or more routines, when executed, calculate timing and amplitudes for a pulse sequence, perform a cost function analysis for each gradient segment in an overlap region for each axis of the pulse sequence, compare an estimate of peripheral nerve stimulation (PNS) associated with the pulse sequence against a PNS limit, adjust one or more of a slew rate and a maximum gradient amplitude for each axis based upon the cost function analysis if the estimate of PNS exceeds the PNS limit, and recalculate the timing and amplitudes for the pulse sequence until the estimate of PNS does not exceed the PNS limit; and
   system control circuitry capable of controlling operation of the scanner control circuitry.

16. The magnetic resonance imaging system of claim 15, wherein the cost function analysis comprises one or more of a total gradient area or a peak gradient amplitude.

17. A computer-readable medium physically encoding one or more routines comprising:
- a routine capable of calculating timing and amplitudes of a pulse sequence;
- a routine capable of calculating a cost for each gradient segment in an overlap region for each axis of the pulse sequence;
- a routine capable of comparing an estimate of peripheral nerve stimulation (PNS) associated with the pulse sequence against a PNS limit;
- a routine capable of adjusting one or more of a slew rate and a maximum gradient amplitude for each axis using the calculated costs of the pulse sequence if the estimate of PNS exceeds the PNS limit; and
- a routine capable of recalculating the timing and amplitudes for the pulse sequence until the estimate of PNS does not exceed the PNS limit.

18. The computer-readable medium of claim 17, wherein the routine capable of adjusting the slew rate reduces the slew rate if the estimate of PNS exceeds the PNS limit.

* * * * *